United States Patent [19]

Urai

[11] Patent Number: 4,908,798

[45] Date of Patent: Mar. 13, 1990

[54] SEMICONDUCTOR MEMORY DEVICE WITH MEMORY CELL ARRAYS AND A REDUNDANT MEMORY CELL ARRAY ASSOCIATED WITH A SMALL NUMBER OF WRITE-IN AND SENSE AMPLIFYING CIRCUITS

[75] Inventor: Takahiko Urai, Tokyo, Japan

[73] Assignee: NEC Corporation, Tokyo, Japan

[21] Appl. No.: 221,969

[22] Filed: Jul. 20, 1988

[30] Foreign Application Priority Data

Jul. 20, 1987 [JP] Japan .................. 62-181612

[51] Int. Cl.⁴ ................. G11C 7/00; G11C 11/40
[52] U.S. Cl. ................. 365/230.03; 365/200; 365/189.02
[58] Field of Search ............ 365/230.03, 200, 51, 365/63, 210, 233, 189.02

[56] References Cited

U.S. PATENT DOCUMENTS

| 4,604,730 | 8/1986 | Yoshida et al. | 365/200 X |
| 4,648,075 | 3/1987 | Segawa et al. | 365/200 X |
| 4,672,581 | 6/1987 | Waller | 365/200 X |
| 4,675,849 | 6/1987 | Kinoshita | 365/230.03 |

FOREIGN PATENT DOCUMENTS

| 53-34430 | 3/1978 | Japan | 365/200 |
| 62-21198 | 5/1987 | Japan . | |
| WO83/02847 | 8/1983 | PCT Int'l Appl. | 365/200 |

Primary Examiner—Stuart N. Hecker
Assistant Examiner—Alfonso Garcia
Attorney, Agent, or Firm—Sughrue, Mion, Zinn, Macpeak & Seas

[57] ABSTRACT

A semiconductor memory device is provided with a plurality of major memory cell blocks divided into sub-blocks and a redundant memory cell block identical in size with each sub-block. A row decoder circuit as well as two stages of column decoder circuits are provided in association with the major memory cell blocks. Write-in/sense amplifier circuits are located between the two stages of the column decoder circuits and a shifting circuit as well as between the redundant memory cell block and the shifting circuit, so that data bits are amplified after the selection and, then, one of the data bits is replaced with a redundant data bit, if necessary.

7 Claims, 4 Drawing Sheets

PRIOR-ART

SEMICONDUCTOR MEMORY DEVICE WITH MEMORY CELL ARRAYS AND A REDUNDANT MEMORY CELL ARRAY ASSOCIATED WITH A SMALL NUMBER OF WRITE-IN AND SENSE AMPLIFYING CIRCUITS

FIELD OF THE INVENTION

This invention relates to a semiconductor memory device and, more particularly, to a switching circuit for replacing a defective memory cell block with a redundant memory cell block.

BACKGROUND OF THE INVENTION

Development efforts are being made for increasing the number of memory cells fabricated on a single semiconductor chip. However, the more memory cells we integrate on a single semiconductor chip, the less yield we suffer in production. One of the approaches to enhance the production yield is to provide a redundant memory cells which are replaced with defective memory cells in the major memory cell array.

In one prior-art semiconductor memory device, the redundant memory cells are arranged in rows, and each row of the redundant memory cells are accompanied by a redundant word line. If a defective memory cell is detected in the major memory cell array during the diagnostic operation, all of the memory cells coupled to the word line together with the defective memory cell are replaced with the redundant memory cells coupled to the redundant word line. Another prior-art semiconductor memory device is provided with a redundant memory cell array arranged in columns, and each column of the redundant memory cells are coupled to a redundant bit line. However, a problem is encountered in these prior-art semiconductor memory devices in limitation of the defective memory cells rescued by the replacement with the redundant memory cells. This is because of the fact that the word line or the bit line coupled to the defective memory cell is in its entirety replaced with the redundant word line or the redundant bit line.

In order to increase the relievable detected memory cells, there is proposed a semiconductor memory device provided with a redundant memory cell array accompanied by both the redundant word lines and the redundant bit lines. However, another problem is encountered in the semiconductor memory device in complexity in arrangement of the switching circuit operative to change the defective memory cell to the replaced redundant memory cell. This complexity results in a delay in transmission of the data bit read out from the redundant memory cell.

One of the solutions is proposed to overcome the problem inherent in the above semiconductor memory device provided with the redundant memory cell array accompanied by both the redundant word lines and the redundant bit lines. The solution is disclosed in, for example, Japanese patent Publication (Kokoku) No. 62-21198. The semiconductor memory device disclosed in the Japanese Patent Publication is illustrated in FIG. 1 of the drawings and comprises a major memory cell array 1 having a plurality of major memory cells arranged in rows and columns, an X decoder circuit 2, a first Y decoder circuit 3, a group of write-in/sense amplifier circuits 4, 5, 6, 7, 8, 9, 10 and 11, a multiplexer 12 and a second Y decoder circuit 13. The major memory cell array 1 is divided into a plurality of major memory cell blocks 14, 15, 16, 17, 18, 19, 20 and 21 each of which is associated with each write-in/sense amplifier circuit 4, 5, 6, 7, 8, 9, 10 or 11. The semiconductor memory device further comprises a redundant memory cell block 22 and an additional write-in/sense amplifier circuit 23 dedicated to the redundant memory cell block 22, and one of the major memory cell blocks is replaceable with the redundant memory cell block 22 if defective memory cells are incorporated in the major memory cell block. This means that the redundant memory cell block 22 should be designed to be identical in size with each major memory cell block.

Upon reading-out operation, a data bit is supplied from each of the major memory cell blocks 14 to 21 to each of the write-in/sense amplifier circuits 4 to 11 in accordance with selections executed by the X decoder circuit 2 and the first Y decoder circuit 3. The X decoder circuit 2 and the first Y decoder circuit 3 also supply the redundant memory cell block 22 with the selecting signals, so that a data bit is read out from the redundant memory cell block 22 and, then, transferred to the write-in/sense amplifier circuit 23. With the selecting signal produced by the second Y decoder circuit 13, one of the data bits fed from the write-in/sense amplifier circuits 4 to 11 is transmitted to an output node. However, if one of the major memory cell block is replaced with the redundant memory cell block 22, the multiplexer 12 transmits the data bit fed from the write-in/sense amplifier circuit 23 to the output node 24 instead of the data bit read out from the major memory cell block incorporating the defective memory cell or cells. Thus, the second Y decoder circuit 23 participates in the alternation of the write-in/sense amplifier circuit. The second Y decoder circuit 13 is relatively simple in circuit arrangement in comparison with the switching circuit described above, so that a negligible amount of delay takes place upon transmission of the data bit.

However, the prior-art semiconductor memory device shown in FIG. 2 has a problem in a large amount of occupation area. Namely, the defective major memory cell block merely has a bit line or some bit lines necessary to be replaced, so that a smaller major memory cell block is preferable for reduction of unusable major memory cells. However, each major memory cell block is accompanied by the write-in/sense amplifier circuit dedicated thereto, so that increasing the number of the major memory cell blocks results in increasing the number of the write-in/sense amplifier circuits. This means that there is a serious trade-off between the number of unusable major memory cells and the number of write-in/sense amplifier circuits. Thus, the semiconductor memory device shown in FIG. 1 consumes a large amount of area on the semiconductor chip.

SUMMARY OF THE INVENTION

It is therefore an important object of the present invention to provide a semiconductor memory device which consumes a relatively small amount of occupation area on a semiconductor chip.

It is also an important object of the present invention to provide a semiconductor memory device which operates at an improved speed.

To accomplish these objects, the present invention proposes to provide two stages of selectors between memory cell groups and combine circuits for write-in and amplifying operations.

In accordance with the present invention, there is provided a semiconductor memory device fabricated on a single semiconductor chip, comprising: (a) a plurality of major memory cell blocks each divided into a plurality of major memory cell sub-blocks, each of the major memory cell sub-blocks having a plurality of major memory cells arranged in rows and columns; (b) a redundant memory cell blocks having a plurality of redundant memory cells arranged in rows and columns, the redundant memory cells being equal in number to the major memory cells of each major memory cell sub-block; (c) a plurality of word lines each coupled to the major memory cells in each row of each major memory cell sub-block, each of the word lines being further coupled to the redundant memory cells in each row of the redundant memory cell block; (d) an X decoder circuit responsive to an row address signal and operative to activate one of the word lines; (e) a plurality of first bit line pairs each coupled to the major memory cells in each column of each major memory cell sub-block, data bits stored in the major memory cells respectively appearing on the first bit line pairs upon activation of the word line; (f) a plurality of second bit line pairs each coupled to the redundant memory cells in each column of the redundant memory cell block, data bits stored in the redundant memory cells respectively appearing on the second bit line pairs upon activation of the word line; (g) a first Y decoder circuit responsive to a column address signal and producing a first control signal; (h) a plurality of first Y selectors each provided in association with one of the major memory cell sub-blocks and the redundant memory cell block, each of the first Y selectors being responsive to the first control signal and operative to select one data bit from the data bits appearing on the first bit line pairs for each major memory cell sub-block or appearing on the second bit line pairs for the redundant memory cell block; (i) a second Y decoder circuit responsive to the column address signal and producing a second control signal and an information signal; (j) a plurality of second Y selector each provided in association with each of the major memory cell blocks, each responsive to the second control signal and operative to transmit one of data bits supplied from the first Y selectors provided in association with each major memory cell sub-block; (k) a plurality of combined circuits for write-in and sense amplifying operations coupled to the second Y selectors and the first selector provided in association with the redundant memory cell block, respectively; (l) a redundant information storage capable of storing memory locations of the major memory cells detected as defective major memory cells, the redundant information storage being responsive to the information signal and operative to produce a third control signal; and (m) a shifting circuit responsive to the third control signal and operative to replace the data bit supplied from one of the defective major memory cells with the data bit supplied from the redundant memory cell, respectively.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

Figure 2:
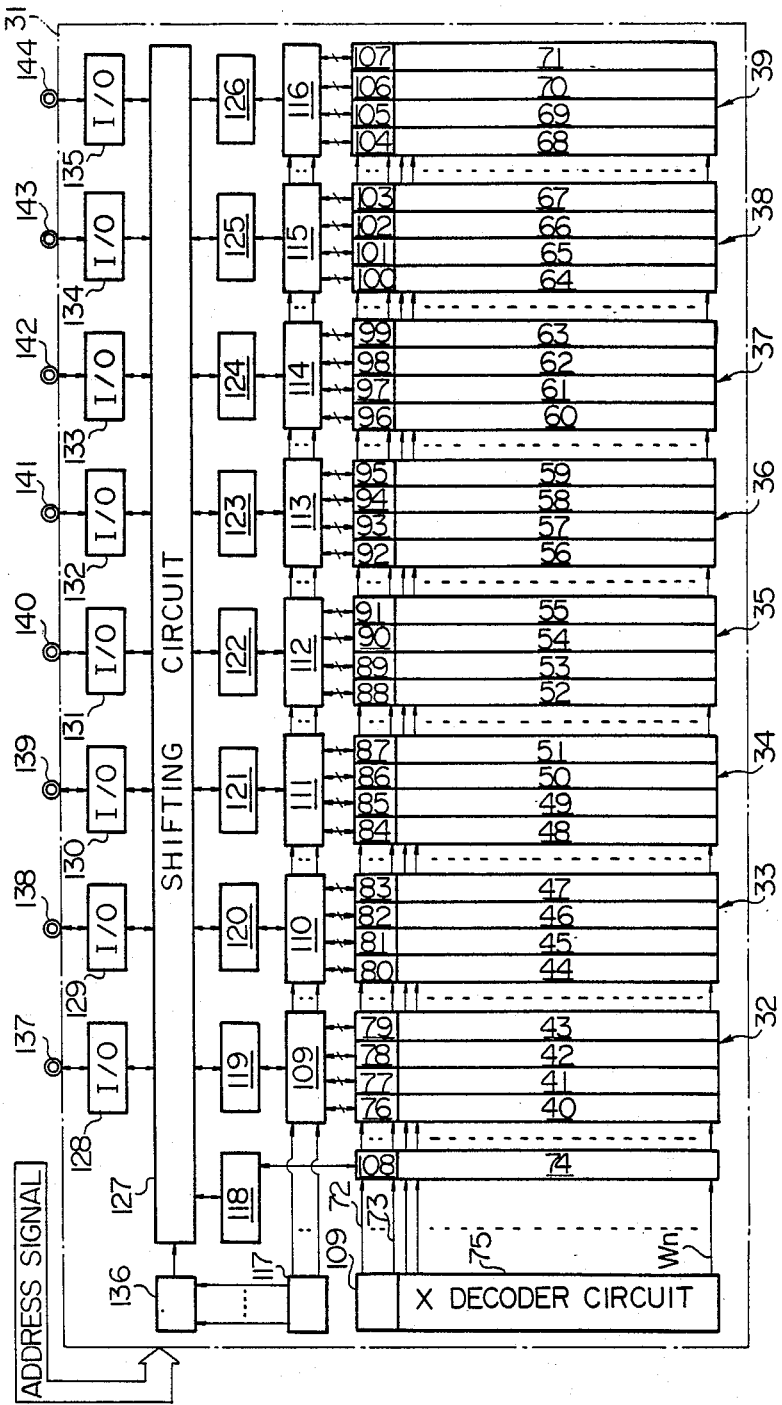
FIG. 2 is a block diagram showing the arrangement of a semiconductor memory device embodying the present invention.

Referring to FIG. 2 of the drawings, there is illustrated a semiconductor memory device fabricated on a single semiconductor chip 31, typically a monocristalline silicon chip. The semiconductor memory device comprises first to eighth major memory cell blocks 32 to 39 each divided into four major memory cell sub-blocks 40 to 43, 44 to 47, 48 to 51, 52 to 55, 56 to 59, 60 to 63, 64 to 67 or 68 to 71. Each of the major memory cell sub-blocks 40 to 71 has a plurality of major memory cells which are arranged in rows and columns. The major memory cell sub-blocks in the same block are arranged in parallel in the column or Y direction, and the major memory cell blocks 32 to 39 are also provided in parallel in the column direction. A plurality of word lines 72, 73, . . . , $W_n$ extend in the row or X direction and passes through all of the major memory cell sub-blocks 40 to 71, and the major memory cells in each row of each major memory cell sub-block are coupled to each word line. Though not shown in the drawings, a plurality of bit line pairs are provided for each major memory cell sub-block, and the major memory cells in the columns of each sub-block are respectively coupled to the bit line pairs.

The semiconductor memory device illustrated in FIG. 2 further comprises a redundant memory cell block 74 which is identical in size with each major memory cell sub-block. In other words, the redundant memory cell block 74 has redundant memory cells which are equal in number to the major memory cells of each major memory cell sub-block and are arranged in the same number of rows and the same number of columns. The redundant memory cell block 74 is located between an X decoder circuit 75 and the major memory cell block 32 in such a manner as to be in parallel to the major memory cell sub-blocks 40 to 43, and the word lines 72 to $W_n$ are further shared by the redundant memory cells in the rows, respectively. The redundant memory cell block 74 is associated with a plurality of bit line pairs each coupled to the redundant memory cells in each column. The X decoder circuit 74 is provided for activating one of the shared word lines 72 to $W_n$ on the basis of a row address signal applied to a set of address terminals (not shown), then data bits are simultaneously read out from not only all of the major memory cell sub-blocks 40 to 71 but also the redundant memory cell block 74 to the bit line pairs.

The major memory cell sub-blocks 40 to 71 are respectively accompanied by first Y selectors 76 to 107, and the redundant memory cell block 74 is also accompanied by a first Y selector 108. All of the first Y selectors 76 to 108 are supplied with a first control signal produced by a first Y decoder circuit 109 on the basis of a column address signal appearing at the address terminals (not shown). With the first control signal supplied from the first Y decoder circuit 109, each of the Y selectors 76 to 107 transmits a data bit appearing on one of the bit line pairs of each major memory cell sub-block to a second Y selector 109, 110 ,111, 112, 113, 114, 115 or 116. Each of the second Y selectors 109 to 116 is provided for each major memory cell block 32, 33, 34, 35, 36, 37, 38 or 39, and a second Y decoder circuit 117 produces a second control signal on the basis of the column address signal for selecting one data bit from the four candidates respectively supplied from the four major memory cell sub-blocks of each major memory cell block. Thus, the eight data bits are selected from all of the data bits read out from the major memory cells coupled to the word line activated by the X decoder circuit 75. The eight data bits are supplied from the second Y selectors 109 to 116 to combined circuits for write-in and sense amplifying operations 119 to 126, however the data bit read out from the redundant memory cell is directly supplied from the first Y selector 108 to combined circuits for write-in and sense amplifying operations 118. All of the combined circuits 118 to 126 are coupled to a shifting circuit 127, and the shifting circuit 127 is capable of replacing a data bit read out from a defective major memory cell with the data bit read out from the redundant memory cell. Namely, if there is no defective major memory cell, the shifting circuit 127 transmits all of the data bits supplied from the combined circuits 119 to 126 to input/output buffer circuits 128 to 135 without the shifting operation. On the other hand, if one of the major memory cells should be replaced with the redundant memory cell, the data bit read out from the defective major memory cell is replaced with the data bit read out from the redundant memory cell by the function of the shifting circuit 127. In order to designate the defective major memory cell, a redundant information storage 136 is provided in association with the shifting circuit 127. The redundant information storage 136 stores the memory locations assigned to the defective major memory cells, so that a third control signal is produced on the basis of an information signal fed from the second Y decoder circuit 117 and is, then, provided to the shifting circuit 127. The input/output buffer circuits 128 to 135 are coupled to input/output data terminals 137 to 144, respectively.

Figure 3:
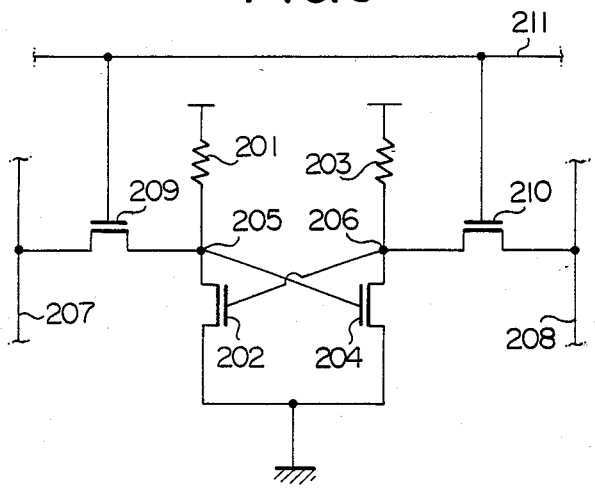
FIG. 3 is a diagram showing a typical example of a static random access memory cell.

In this instance, each of the major memory cells and the redundant memory cells is formed by a static random access memory cell a typical example of which is illustrated in FIG. 3. The static random access memory cell comprises first series combination of a resistor 201 and a field effect transistor 202, and a second series combination of a resistor 203 and a field effect transistor 204. Two memory nodes 205 and 206 are respectively provided between the resistors 201 and 203 and the field effect transistors 202 and 204, and the gate electrodes of the field effect transistors 202 and 204 are coupled to the memory nodes 206 and 205, respectively. Two switching transistors 209 and 210 are provided between the memory nodes 205 and 206 and a pair of bit lines 207 and 208 (which is called as a bit line pair), respectively, and the switching transistors 209 and 210 are simultaneously gated by a word line 211 for accessing a data bit stored therein. the data bit is stored in the form of difference in voltage level between the two memory nodes 205 and 206.

Figure 4:
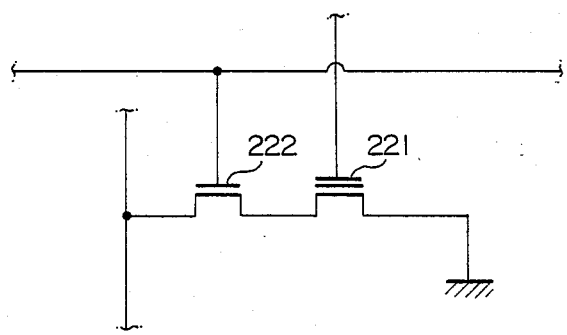
FIG. 4 is a diagram showing a typical example of an electrically erasable programmable read only memory cell.
Figure 5:
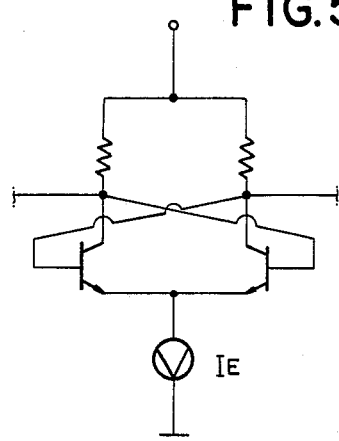
FIG. 5 is a diagram showing a typical example of an emitter coupled logic gate.
Figure 6:
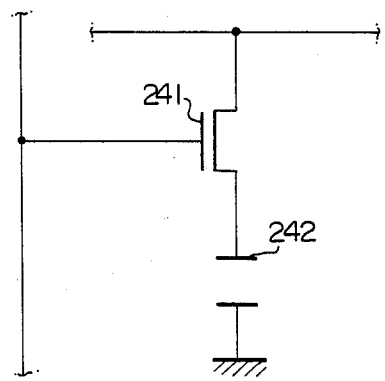
FIG. 6 is a diagram showing a typical example of a dynamic random access memory cell.

However, in another implementation, each of the major memory cells and the redundant memory cells may be formed by an electrically erasable programmable read only memory cell. A typical example of the electrically erasable programmable read only memory cell is illustrated in FIG. 4 and largely comprises a series combination of a floating gate type MOS field effect transistor 221 and a switching transistor 222. In this implementation, a data bit is stored in the form of electric charges injected into the floating gate of the MOS field effect transistor 221. FIG. 5 shows the circuit arrangement of an emitter coupled logic gate which may be incorporated in the static random access memory instead of the first and second series combinations shown in FIG. 3. A dynamic random access memory cell is available for each of the major memory cells and the redundant memory cells. A typical example of the dynamic random access memory cell is illustrated in FIG. 6 and comprises a series of a switching transistor 241 and a storage capacitor 242. The dynamic random access memory cell stores a data bit in the form of electric charges of the storage capacitor 242.

Operations will be hereinunder described in detail. If some defective major memory cells are detected in the diagnostic stage, the memory locations assigned to the defective major memory cells are written into the redundant information storage 136, so that the defective major memory cells will be replaced with the redundant memory cells of the redundant memory cell block 74. When the row address signal is supplied to the address terminals, the X decoder circuit 75 activates the word line to which the defective major memory cell is coupled. In the presence of the column address signal, the second Y decoder circuit 117 produces the second control signal for selecting one of the first Y selectors of each major memory cell block. The second Y decoder circuit 117 further produces the information signal causing the redundant information storage 136 to produce the third control signal for providing a path from one of the input/output buffer circuits 128 to 135 to the combined circuits 118. The first Y decoder circuit 109 produces the first control signal for selecting one bit line pair for each major memory cell sub-blocks and the redundant memory cell block 74. The bit line pair for the redundant memory cell block 74 corresponds to the bit line pair to which the defective major memory cell is coupled. Thus, one of the redundant memory cell is coupled to one of the input/output buffer circuits 128 to 135, so that one of the data bits is memorized in the redundant memory cell instead of the defective memory cell.

The read-out operation is carried out as follows. When the row address signal is supplied to the address terminals, the X decoder circuit 75 activates the word line to which the defective major memory cell is coupled. Then, the data bits are read out from all of the major memory cells and the redundant memory cell coupled to the activated word line to the respective bit line pairs. The first and second Y decoder circuits 109 and 117 produce the respective first and second control signals on the basis of the column address signal for transferring the data bits from the bit line pairs to the combined circuits 118 to 126, respectively. The second Y decoder circuit further produces the information signal supplied to the redundant information storage 136, and the redundant information storage 136 produces the third control signal causing the shifting circuit 127 to establish a path from the combined circuits 118 to one of the input/output buffer circuits 128 to 135. However, no path is established between the combined circuits supplied with the data bit read out from the defective major memory cell and the input/output buffer circuit in the presence of the third control signal. Then, the data bit stored in the defective major memory cell is replaced with the data bit stored in the redundant memory cell.

As will be understood from the foregoing description, each of the major memory cell blocks 32 to 39 is divided into the four sub-blocks and one of which is replacable with the redundant memory cell block 74, so that unusable main memory cells are reduced in number. Moreover, the data bits are selected by the two stages of the Y selectors, so that it is sufficient to provide the combined circuits 119 to 126 equal in number to the major memory cell blocks 32 to 39. These results in reduction of the occupation area on the semiconductor chip. As to the improvement of the reading-out speed, it is possible to arrange the internal signals in such a manner that the shifting operation is completed before determination of the logic levels of the data bits read out from the major memory cells and the redundant memory cell. This is because of the fact that the shifting circuit 127 is located downstream of the combined circuits 118 to 126. Thus, no delay takes place in the shifting circuit 127, thereby improving the reading-out speed.

Although particular embodiment of the present invention have been shown and described, it will be obvious to those skilled in the art that various changes and modifications may be made without departing from the spirit and scope of the present invention.

What is claimed is:

1. A semiconductor memory device fabricated on a single semiconductor chip, comprising:
   (a) a plurality of major memory cell blocks each divided into a plurality of major memory cell sub-blocks, each of said major memory cell sub-blocks having a plurality of major memory cells arranged in rows and columns;
   (b) a redundant memory cell block having a plurality of redundant memory cells arranged in rows and columns, said redundant memory cells being equal in number to said major memory cells of each major memory cell sub-block;
   (c) a plurality of word lines each coupled to said major memory cells in each row of each major memory cell sub-block, each of said word lines being further coupled to said redundant memory cells in each row of said redundant memory cell block;
   (d) a row decoder circuit responsive to a row address signal and operative to activate one of said word lines;
   (e) a plurality of first bit line pairs each coupled to said major memory cells in each column of each major memory cell sub-block, data bits stored in said major memory cells respectively appearing on said first bit line pairs upon activation of said word line;
   (f) a plurality of second bit line pairs each coupled to said redundant memory cells in each column of said redundant memory cell block, data bits stored in said redundant memory cells respectively appearing on said second bit line pairs upon activation of said word line;
   (g) a first column decoder circuit responsive to a column address signal and producing a first control signal;
   (h) a plurality of first column selectors each provided in association with one of said major memory cell sub-blocks and said redundant memory cell block, each of said first column selectors being responsive to said first control signal and operative to select one data bit from said data bits appearing on said first bit line pairs for each major memory cell sub-block or appearing on said second bit line pairs for said redundant memory cell block;
   (i) a second column decoder circuit responsive to said column address signal and producing a second control signal and an information signal;
   (j) a plurality of second column selectors each provided in association with each of said major memory cell blocks, each responsive to said second control signal and operative to transmit one of data bits supplied from said first column selectors provided in association with each major memory cell sub-block;
   (k) a plurality of combined circuits for write-in and sense amplifying operations coupled to said second column selectors and said first selector provided in association with said redundant memory cell block, respectively;
   (l) a redundant information storage capable of storing memory locations of said major memory cells detected as defective major memory cells, said redundant information storage being responsive to said information signal and operative to produce a third control signal; and
   (m) a shifting circuit responsive to said third control signal and operative to replace the data bit supplied from one of said defective major memory cells with the data bit supplied from said redundant memory cell, respectively.

2. A semiconductor memory device as set forth in claim 1, in which each of said major memory cells and said redundant memory cells is of a static random access memory.

3. A semiconductor memory device as set forth in claim 2, in which each of said major memory cells and said redundant memory cells is formed by an emitter coupled logic gate.

4. A semiconductor memory device as set forth in claim 1, in which each of said major memory cells and said redundant memory cells is of a dynamic random access memory.

5. A semiconductor memory device as set forth in claim 1, in which each of said major memory cells and said redundant memory cells is of an electrically erasable programmable read only memory.

6. A semiconductor memory device as set forth in claim 1, in which said semiconductor memory device has eight main memory cell blocks.

7. A semiconductor memory device as set forth in claim 6, in which each of said main memory cell blocks is divided into four main memory cell sub-blocks.

* * * * *

UNITED STATES PATENT AND TRADEMARK OFFICE
CERTIFICATE OF CORRECTION

PATENT NO. : 4,908,798
DATED : March 13, 1990
INVENTOR(S) : Takahiko URAI

Figure 1:
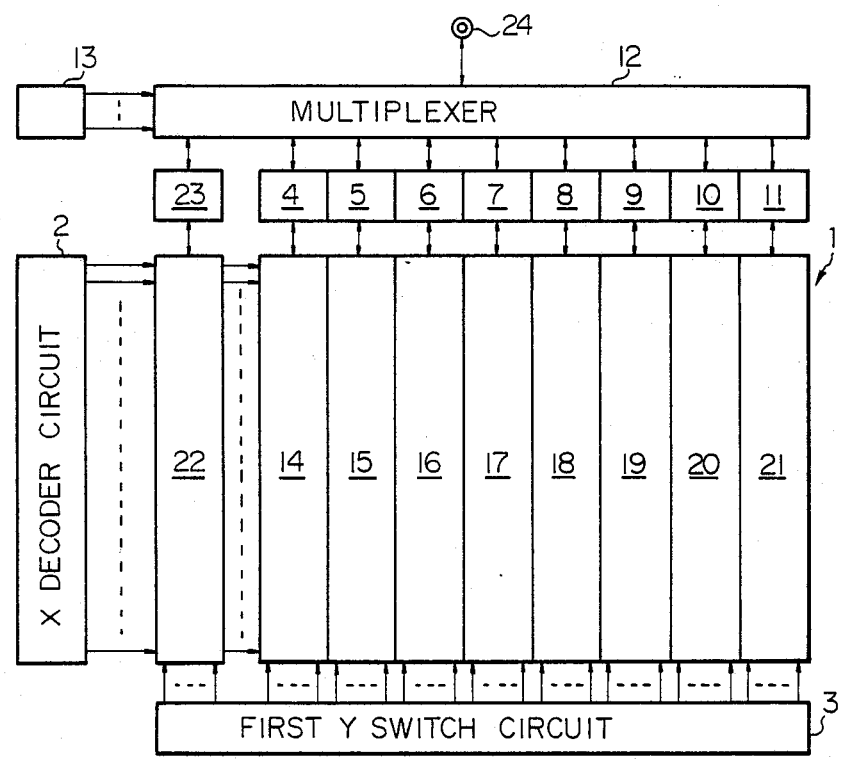
FIG. 1 is a block diagram showing the arrangement of the semiconductor memory device disclosed in Japanese Publication Pat. No. 62-21198.

It is certified that error appears in the above-identified patent and that said Letters Patent is hereby corrected as shown below:

Col. 2, line 40, delete "FIG. 2" and insert --FIG. 1--.

Signed and Sealed this

Thirteenth Day of August, 1991

Attest:

HARRY F. MANBECK, JR.

Attesting Officer

Commissioner of Patents and Trademarks